United States Patent
Sridhar et al.

(10) Patent No.: US 6,303,420 B1
(45) Date of Patent: Oct. 16, 2001

(54) INTEGRATED BIPOLAR JUNCTION TRANSISTOR FOR MIXED SIGNAL CIRCUITS

(75) Inventors: Seetharaman Sridhar, Irving; Amitava Chatterjee, Plano; Hisashi Shichijo, Plano; Alec J. Morton, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/618,413

(22) Filed: Jul. 18, 2000

Related U.S. Application Data

(60) Provisional application No. 60/148,843, filed on Aug. 13, 1999.

(51) Int. Cl.⁷ .................................................. H01L 21/8238
(52) U.S. Cl. ........................... 438/202; 438/234; 438/309
(58) Field of Search .................................. 438/202, 203, 438/204, 205, 234, 236, 326, 309

(56) References Cited

U.S. PATENT DOCUMENTS 5,888,861 * 3/1999 Chien et al. .................... 438/202
6,001,701 * 12/1999 Carroll et al. .................. 438/234
6,117,716 * 9/2000 Manning ........................ 438/202

FOREIGN PATENT DOCUMENTS

| 595484-A1 | * | 5/1994 | (EP) . |
| 613181-A2 | * | 8/1994 | (EP) . |
| 736898-A2 | * | 1/1996 | (EP) . |
| 789400-A2 | * | 8/1997 | (EP) . |

* cited by examiner

Primary Examiner—Trung Dang
(74) Attorney, Agent, or Firm—Peter K. McLarty; W. James Brady, III; Frederick J. Telecky, Jr.

(57) ABSTRACT

A method for forming integrated circuit bipolar junction transistors for mixed signal circuits. The implants used to form the well regions of the CMOS circuits 20, 40 form the collector regions of bipolar junction transistors. The CMOS transistor pocket implants form the base region of the bipolar junction transistor, and the CMOS drain extension implants form the emitter region of the bipolar junction transistor.

16 Claims, 9 Drawing Sheets

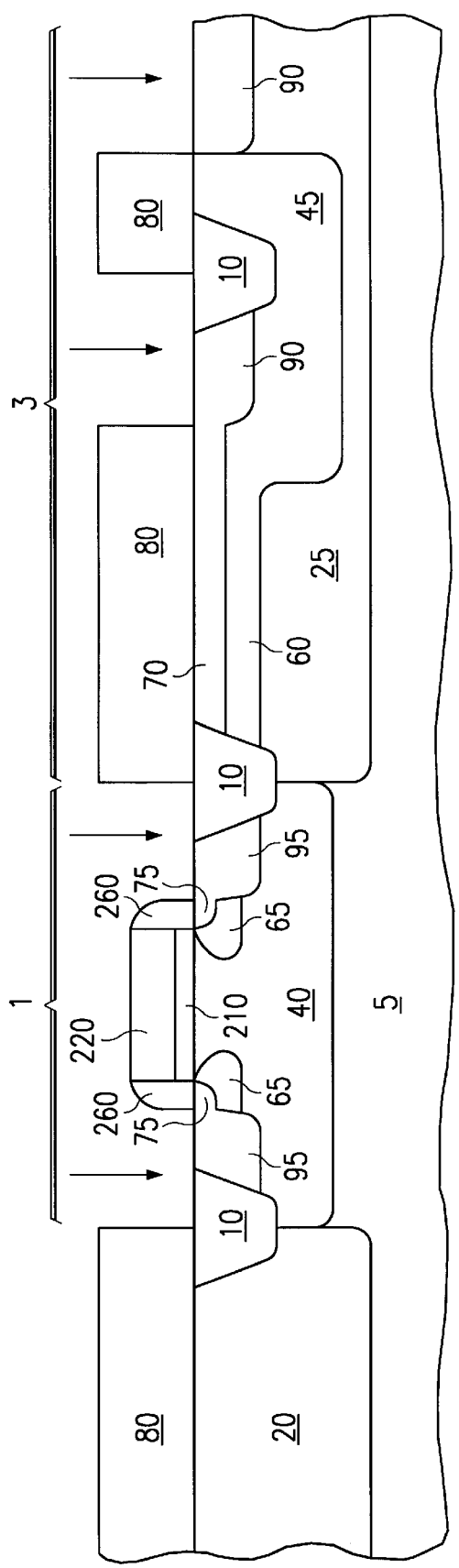
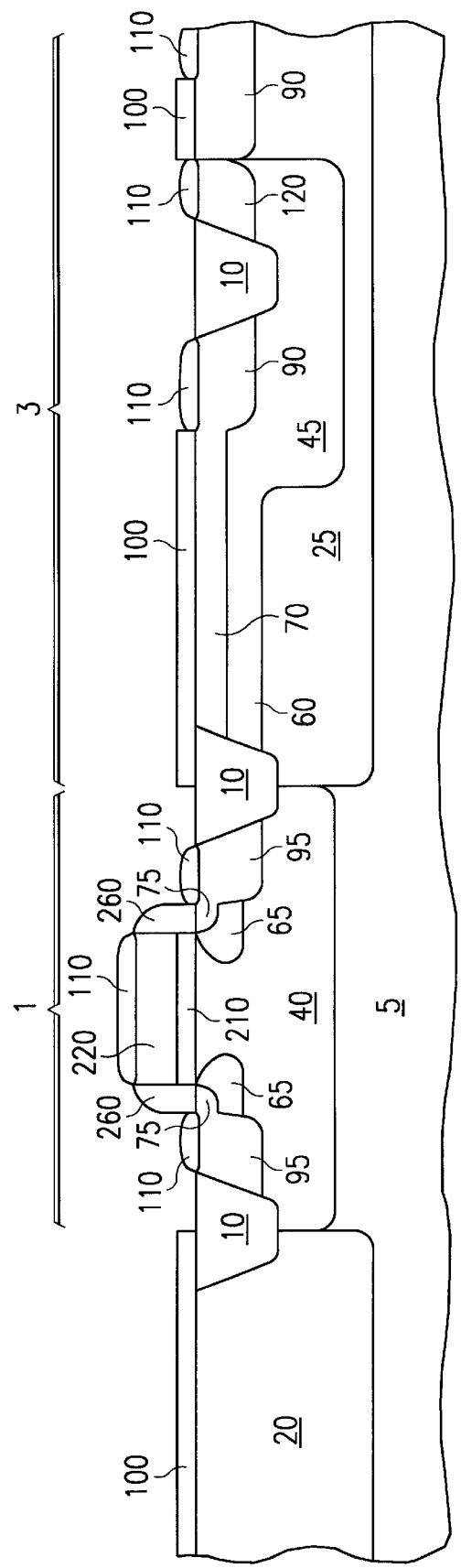
FIG. 1C
FIG. 1D

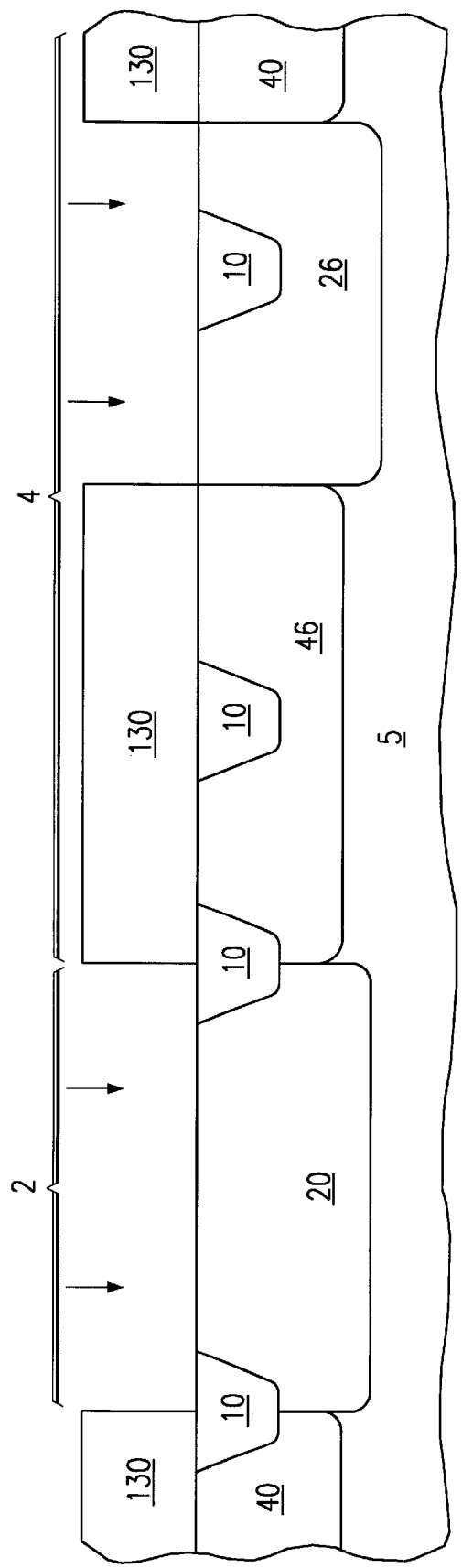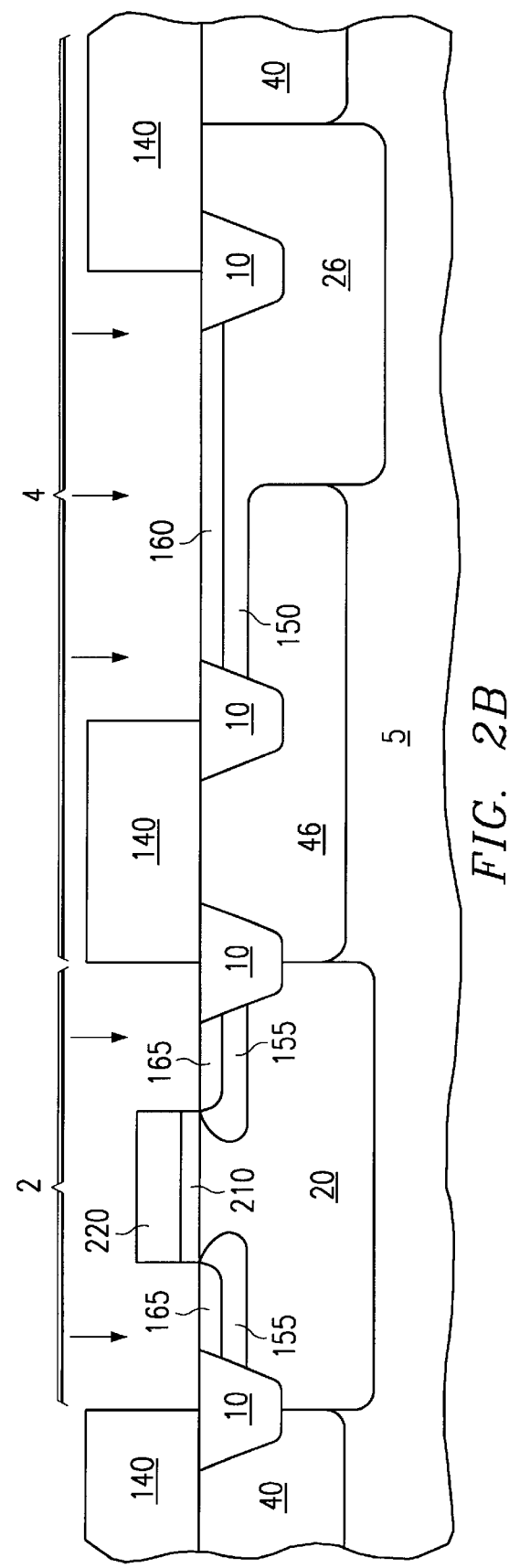
FIG. 2A
FIG. 2B

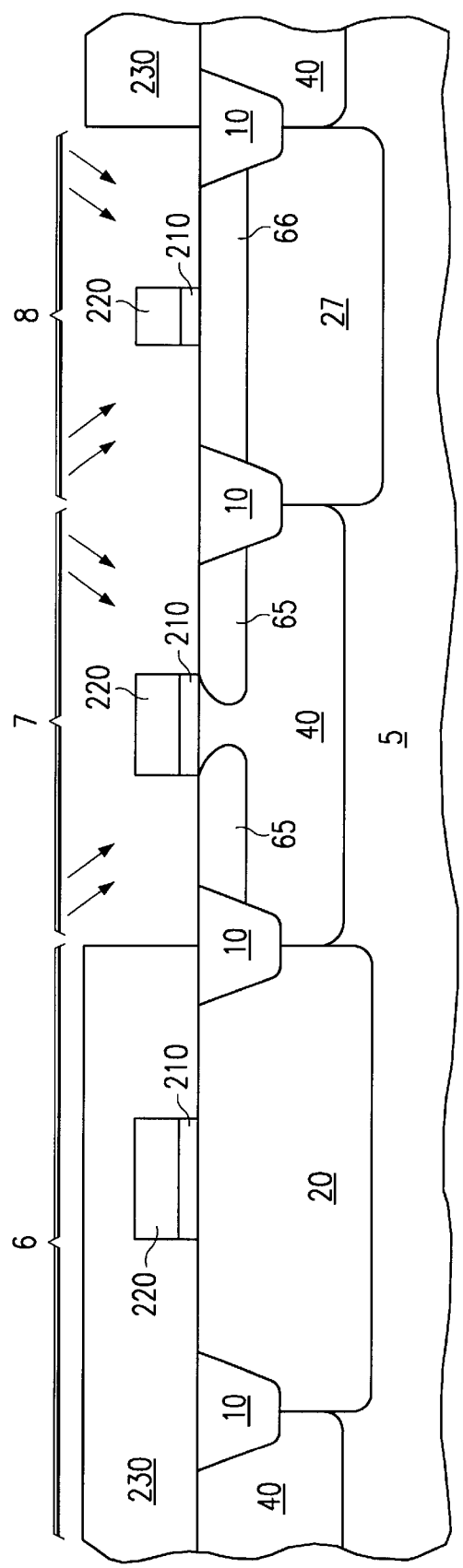
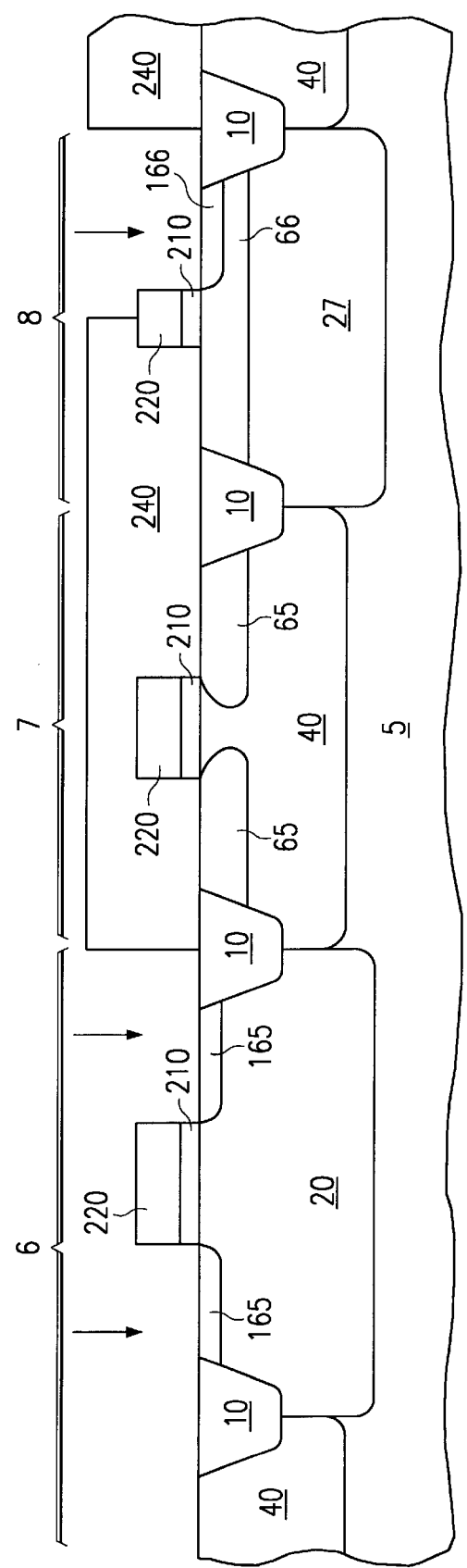
FIG. 5A
FIG. 5B

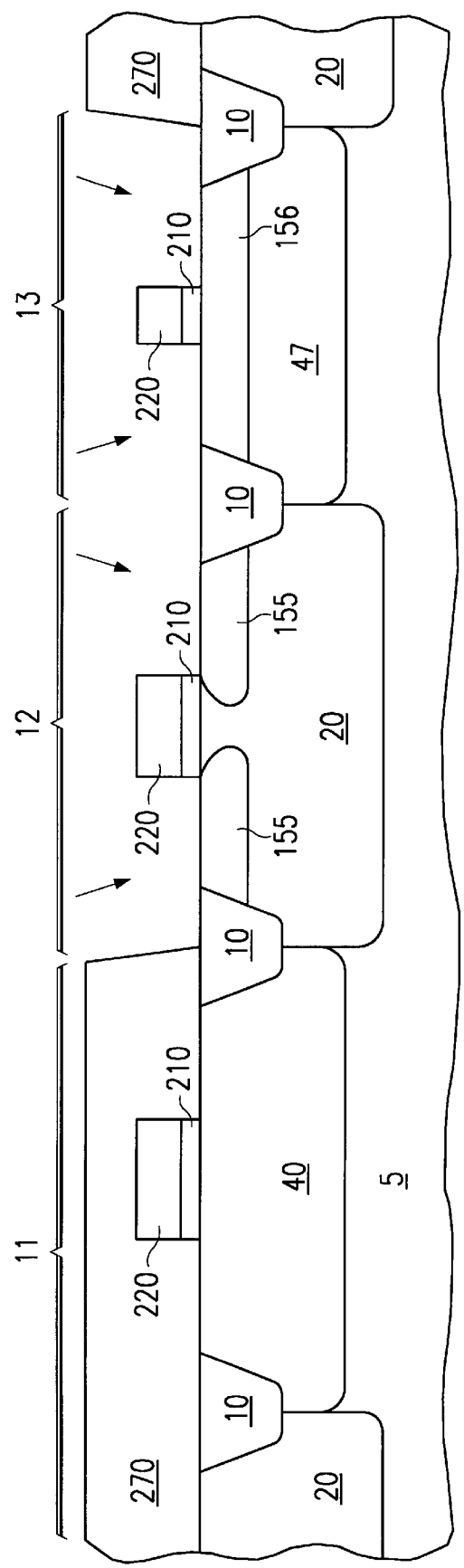
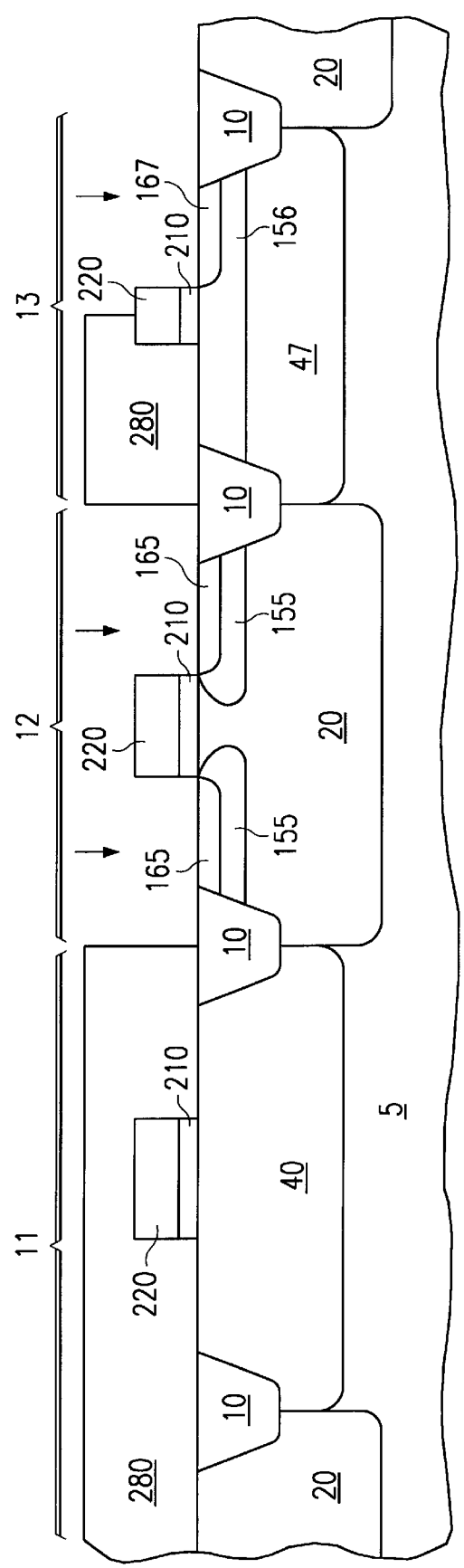
FIG. 6A
FIG. 6B

INTEGRATED BIPOLAR JUNCTION TRANSISTOR FOR MIXED SIGNAL CIRCUITS

This application claims Benefit of Provisional Application Ser. No. 60/148,843 filed Aug. 13, 1999.

FIELD OF THE INVENTION

The invention is generally related to the field of integrated circuit bipolar junction transistors and more specifically to a novel method to achieve high performance bipolar junction transistors integrated with high performance CMOS transistors with reduced masked steps.

BACKGROUND OF THE INVENTION

For mixed signal circuits it is often important to have high performance bipolar junction transistors integrated with high performance CMOS transistors on the same chip. The bipolar junction transistors will be used for analog signal processing for such functions as providing silicon bandgap reference voltages. Current mixed signal integrated circuits contain bipolar junction transistors fabricated using dedicated processes that require extra masking steps and specific implant conditions tailored for the bipolar junction transistor. These extra masking steps and specific implants conditions add extra cost to fabricating these mixed signal integrated circuits.

High performance CMOS transistors for mixed signal applications require a number of different implants to form the n-type and p-type wells. They also require NMOS and PMOS threshold voltage adjust implants, NMOS and PMOS drain extension implants, NMOS and PMOS pocket or halo implants, and NMOS and PMOS source-drain implants. The n-type and p-type well implants form the regions in the semiconductor body where the PMOS and NMOS transistors will be formed. The NMOS and PMOS threshold voltage adjust implants set the threshold voltages for these transistors by varying the substrate doping beneath the transistor gate dielectric. The very short transistor gate length used in mixed signal CMOS transistors make them susceptible to hot carrier injection. To reduce this effect, NMOS and PMOS drain extension implants (LDD) are utilized. In this disclosure, LDD will be used to represent any drain extension type implant. The drain extension typically extend the heavily doped source and drain regions further under the gate of the transistor. In high performance mixed signal CMOS transistors, pocket or halo implants are used to reduce the effect of the short transistor gate length on transistor properties such as threshold voltage. The effect of the pocket implant is not however limited to threshold voltage. The pocket implant for a particular transistor type usually results in a doping profile that extends beyond the drain extension of the transistor.

A number of mixed signal integrated circuits require a bipolar junction transistor with a beta($\beta$) greater than 5. There is therefore great need for a reduced masking step process that will result in high performance integrated circuit bipolar junction transistor integrated in a circuit with high performance CMOS transistors.

SUMMARY OF THE INVENTION

The instant invention is a method to achieve high performance bipolar junction transistors integrated with high performance CMOS transistors using a reduced number of masking steps. The method comprises: providing a semiconductor body; forming a collector region of said integrated circuit bipolar junction transistor with a plurality of implants; forming a base region of said integrated circuit bipolar junction transistor with a metal oxide semiconductor transistor pocket implant; and forming a emitter region of said integrated circuit bipolar junction transistor with a metal oxide semiconductor transistor drain extension implant.

The main advantage of the method is the integration of a high performance bipolar junction transistor with MOS transistors without adding additional photolithographic masking steps.

BRIEF DESCRIPTION OF THE DRAWINGS

In the drawings:

FIGS. 1A–1D are cross-sectional diagrams at various steps in the fabrication of the vertical pnp bipolar junction transistor and a PMOS transistor according to an embodiment of the instant invention.

FIGS. 2A–2D are cross-sectional diagrams at various steps in the fabrication of the vertical npn bipolar junction transistor and a NMOS transistor according to an embodiment of the instant invention.

FIGS. 5A–5D are cross-sectional diagrams at various steps in the fabrication of the pnp bipolar junction transistor, a NMOS transistor and a PMOS transistor according to an embodiment of the instant invention.

FIGS. 6A–6D are cross-sectional diagrams at various steps in the fabrication of the npn bipolar junction transistor, a NMOS transistor, and a PMOS transistor according to an embodiment of the instant invention.

Figure 1A:
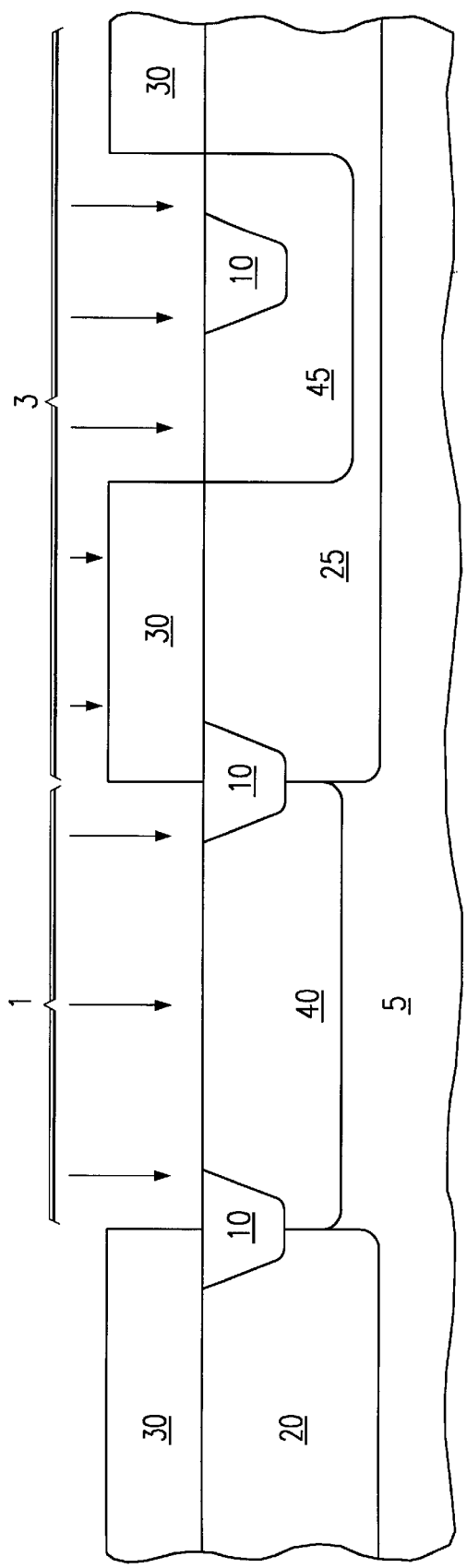

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1–6, the instant invention can be utilized in any semiconductor device structure. The methodology of the instant invention provides a process to achieve high performance bipolar junction transistors integrated with high performance CMOS transistors with reduced masked steps. The process will be described using the CMOS process steps.

The following description of the instant invention will be related to FIGS. 1–6. It should be assumed that in all the embodiments described a contact exists to each p-well 20 and n-well region 40 shown as well as regions 25, 26, 27, 45, 46, and 47. Referring to FIG. 1A, a semiconductor body 5 is provided and isolation structures 10 are formed in the semiconductor body. These isolation structures may be formed using silicon oxide or other suitable insulators. The purpose of the isolation structure 10 is to provide electrical isolation for the active devices on the semiconductor body. The isolation structure 10 can be formed using a technique known as Shallow Trench Isolation (STI). In this technique a shallow trench is formed in the semiconductor body 5 which is subsequently filled with an insulating material consisting usually of a deposited oxide. This deposited oxide is conformal and will follow the contours of the silicon surface resulting in an oxide film of equal thickness both in the trench and on the silicon surface where the devices are to be fabricated. Chemical mechanical polishing (CMP) is then used to planarize the surface of the semiconductor body 5. Although specific embodiments will be described using STI, another isolation structure type known as local oxidation (LOCOS) could also be used. Following the formation of the isolation structures, a number of p-type implants are performed to form the p-well region 20 and the collector region 25. In a specific embodiment the following four p-type implants are performed: a well implant of $1 \times 10^{13} - 5 \times 10^{13}$ $cm^2$ boron at 250 keV–500 keV; a channel stop implant of $5 \times 10^{12}$ $cm^2$–$9.5 \times 10^{12}$ $cm^2$ boron at 120 keV–170 keV; a punch through implant of $3 \times 10^{12}$ $cm^2$–$9 \times 10^{12}$ $cm^2$ boron at 30 keV–85 keV; and a threshold voltage implant of $1 \times 10^{12}$ $cm^2$–$5 \times 10^{12}$ $cm^2$ boron at 10 keV–40 keV. The punch through implant is used to reduce source-drain leakage current in the NMOS transistor and the threshold voltage implant is used to adjust the threshold voltage in the NMOS transistor. In other embodiments it is possible Lo have the p-well implant and any combination of the additional implants. During the formation of regions 20 and 25, a photoresist mask can be used to block the implant from entering regions 40 and 45.

A photoresist film is formed and patterned 30 as shown in FIG. 1A. The patterned photoresist film 30 is used as a implant mask for the n-type implants necessary to form the n-well region 40 and the base extension region 45. In other areas of the semiconductor body 5, the patterned resist film 30 will be used to mask the areas where no n-well formation is required. In a specific embodiment the following four n-type implants are performed to form the n-well region 40 and base extension region 45: a well implant of $1 \times 10^{13}$–$5 \times 10^{13}$ $cm_2$ phosphorous at 600 keV–900 keV; a channel stop implant of $2 \times 10^{12}$ $cm^2$–$7.5 \times 10^{12}$ $cm^2$ phosphorous at 200 keV–400 keV; a punch through implant of $3 \times 10^{12}$ $cm^2$–$9 \times 10^2$ $cm^2$ phosphorous at 100 keV–220 keV; and a threshold voltage implant of $1 \times 10^{12}$ $cm^2$–$5 \times 10^{12}$ $cm^2$ phosphorous at 30 keV–60 keV. The punch through implant is used to reduce source-drain leakage current in the PMOS transistor and the threshold voltage implant is used to adjust the threshold voltage in the PMOS transistor. In other embodiments it is possible to have the n-well implant and any combination of the additional implants. The above described implants does not require adding extra masking steps to the CMOS process as both of these masks are used in forming the n-well and p-well regions for CMOS transistor fabrication.

Figure 1B:
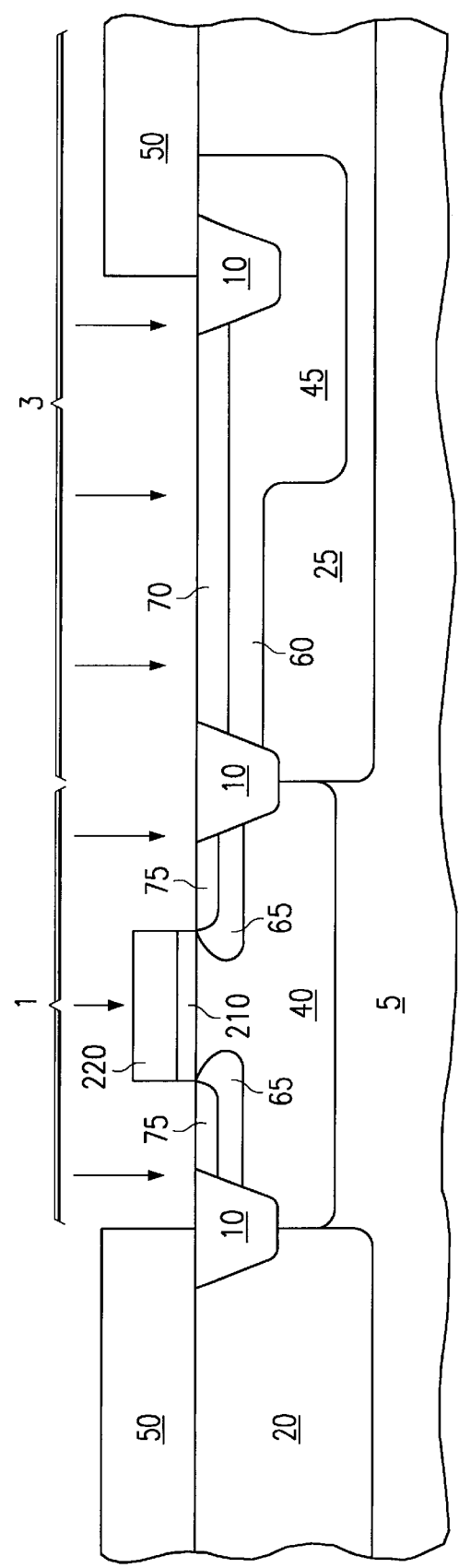

Shown in FIG. 1B is the structure of FIG. 1A after additional processing. The PMOS transistor will be fabricated in section 1 of the semiconductor body and the pnp transistor in section 3. A gate dielectric layer 210 and a gate electrode layer 220 are formed in section 1 as part of the PMOS transistor. The gate dielectric may comprise silicon oxide, silicon nitride, silicon oxynitride or other suitable material. The gate electrode may be polycrystalline silicon or other suitable material. These layers 210, 220 are formed and patterned using standard processing methods. The patterned photoresist film 50 is used to mask areas of the semiconductor body 5, during subsequent implants. The photoresist film 50 represents masks that are present during each implant that will be described. The implants however do not have to be performed sequentially and the photoresist film 50 can be removed after each implant and reformed before the next implant to allow additional processes to be performed between implants. Region 60 is formed using the n-type pocket implant. This implant is simultaneously applied to the PMOS transistor (to control the short channel effects) resulting in region 65. During this process, the photoresist mask 50 will block this implant from entering the NMOS transistors but will allow region 60 and 65 to be formed. In a specific embodiment this implant could be $3 \times 10^{13}$ $cm^2$ –$9 \times 10^{13}$ $cm^2$ phosphorous at 50 keV–90 keV at 25° with four way rotation. Region 60 will form a contiguous n-type region with the base extension region 45. A photoresist mask 50 is also used to form region 70 which is formed using the p-type drain extension implant. The p-type drain extension implant is used to from the drain extension region for the PMOS transistor 75. In a specific embodiment this implant could be $1 \times 10^{14}$ $cm^2$–$5 \times 10^{14}$ $cm^2$ BF2 at 15 keV–30 keV.

Illustrated in FIG. 1C is the structure of FIG. 1B with additional processing. The sidewall structures 260 are formed using standard processing and may comprise silicon nitride or other suitable material. A patterned photoresist mask 80 is used to mask the semiconductor body during the p-type source-drain implant. The mask 80 will also be used to block the p-type source-drain implant from entering the NMOS devices. Resulting from this implant will be the formation of regions 90 and 95 as shown in FIG. 1C. Region 95 will function as the source-drain areas of the PMOS transistor. In a specific embodiment this implant could be $1 \times 10^{15}$ $cm^2$–$5 \times 10^{15}$ $cm^2$ boron at 5 keV–15 keV. In some areas region 90 will form a contiguous p-type area with region 70.

Shown in FIG. 1D is the structure of FIG. 1C after additional processes. Region 120 is formed using the n-type source-drain implant which is also used to form the source-drain region of the NMOS transistor. A patterned photoresist mask is used to block the implant from entering the other regions of FIG. 1D. A silicide block layer 100 is formed and used to prevent metal silicide formation in specific areas of the semiconductor body. The silicide block layer 100 can be formed using silicon nitride, silicon oxide, or any layer with similar properties. The metal silicide layers 110 are formed using standard processing techniques. Regions 70, 60 and 25 will form the emitter, base, and collector region of the transistor respectively. Regions 90, 45, and 120 provides means to electrically contact the emitter, base, and collector region of the transistor.

Figure 2C:
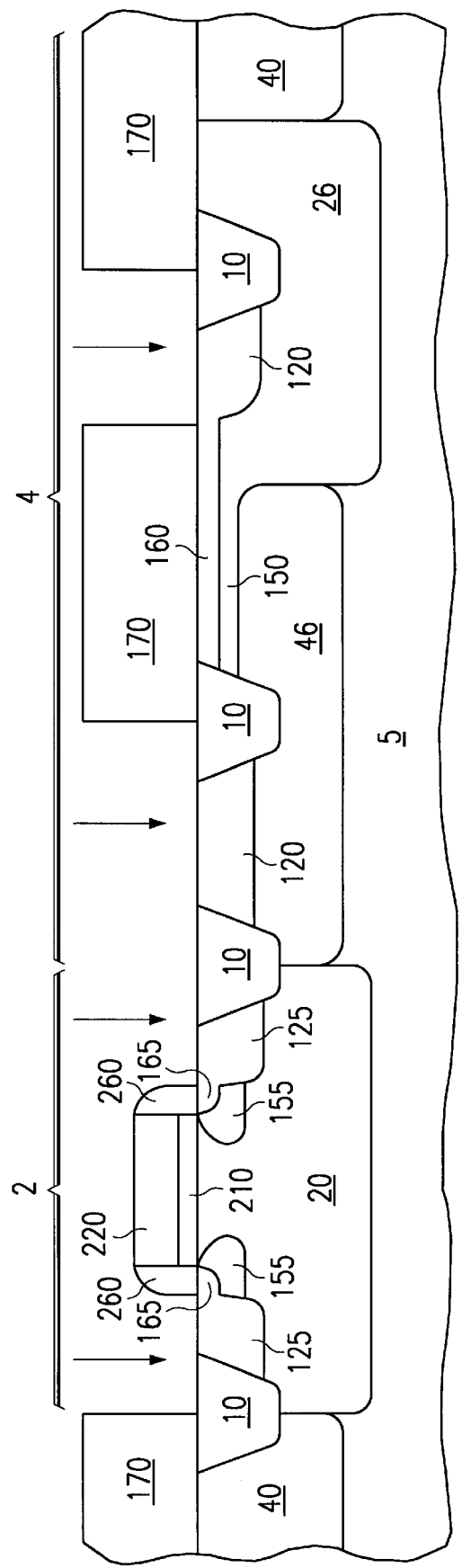

Shown in FIGS. 2A–2D are further embodiments of the instant invention. In FIG. 2A, the n-type implant processes described above are used to form regions 40 and 46. The p-type implant processes are used to form regions 20 and 26 and the photoresist mask 30 will block these implants from entering other regions of the semiconductor body 5. In this case, it may be necessary to use additional photoresist masks to prevent the regions 20 and 26 from receiving both implants. The relative concentrations of both the n-type and p-type dopant species used in integrated circuit processing might result in regions 20 and 26 being compensated n-type if it received both implants. Such masks are used in forming the n-type and p-type well regions for the CMOS circuits and would not result in any extra masking steps. As shown in FIG. 2B, the NMOS transistor will be fabricated in section 2 of the semiconductor body and the npn transistor in section 4. A gate dielectric layer 210 and a gate electrode layer 220 are formed in section 2 as part of the NMOS transistor. The gate dielectric may comprise silicon oxide, silicon nitride, silicon oxynitride or other suitable material. The gate electrode may be polycrystalline silicon or other suitable material. These layers 210, 220 are formed and patterned using standard processing methods. With a patterned photoresist mask in place 140, a p-type pocket implant is used to from regions 150 and 155, and a n-type drain extension implant used to form regions 160 and 165. As shown in the Figure, the p-type pocket implant and the n-type drain extension implants are used in the formation of the NMOS transistor. Region 150 will form a contiguous p-type region with the base extension region 26. In a specific embodiment, this p-type pocket implant and n-type drain extension implant could be $1 \times 10^{13}$ cm$^2$–$5 \times 10^{13}$ cm$^2$ boron implant at 15 keV–35 keV at 25° with a four way rotation and $2 \times 10^{14}$ cm$^2$–$9 \times 10^{15}$ cm$^2$ arsenic at 5 keV–25 keV respectively.

Illustrated in FIG. 2C is the structure of FIG. 2B with additional processing. A patterned photoresist mask 170 is used to mask the semiconductor body during the n-type source-drain implant. The mask 170 will also be used to block the n-type source-drain implant from entering the PMOS devices. Resulting from this implant will be the formation of regions 120 and 125 as shown in FIG. 1C. In some areas region 120 will form a contiguous p-type area with region 160. Region 125 will function as the source and drain of the NMOS transistor.

Figure 2D:
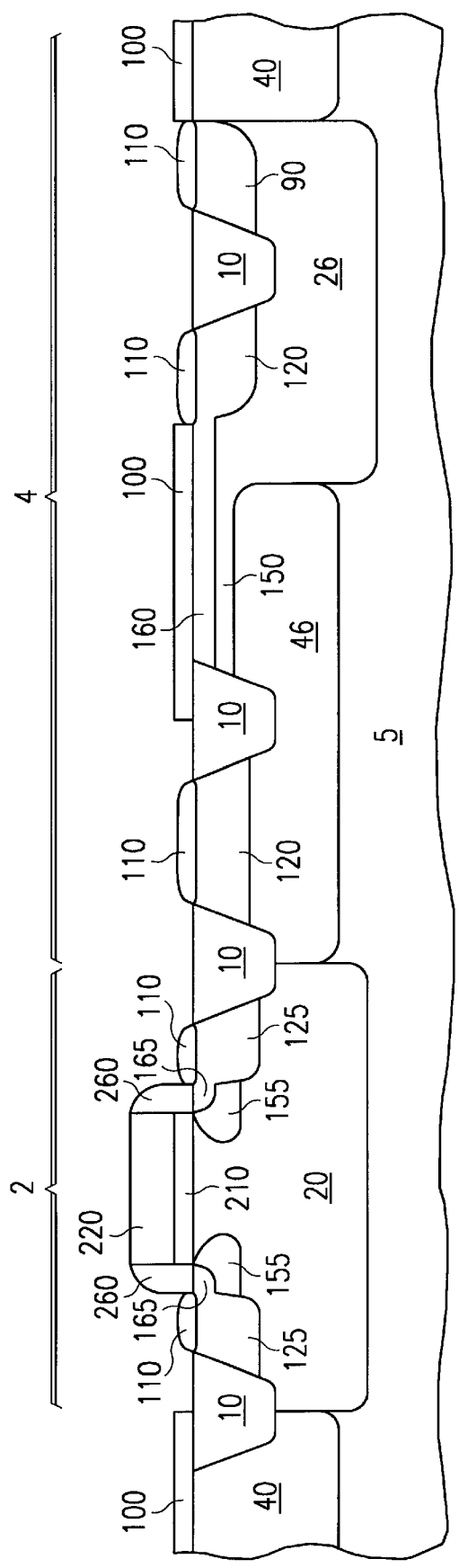

Shown in FIG. 2D is the structure of FIG. 2C after additional processes. Region 90 is formed using the p-type source-drain implant which is also used to form the source-drain region of the PMOS transistor. A patterned photoresist mask is used to block the implant from entering the other regions of FIG. 2D. A silicide block layer 100 is formed and used to prevent metal silicide formation in specific areas of the semiconductor body. The silicide block layer 100 can be formed using silicon nitride, silicon oxide, or any layer with similar properties. The metal silicide layers 110 are formed using standard processing techniques. Regions 160, 150 and 46 will form the emitter, base, and collector region of the transistor respectively. Regions 120, 26, and 90 provides means to electrically contact the emitter, base, and collector region of the transistor.

If additional MOS transistors are present as part of the integrated circuit, then processes used in forming these transistors can also be used in forming the integrated bipolar junction transistors. For example if input-output transistors are used, then the pocket implants and the drain extension implants associated with these devices can be used either singly or in combination with the implants discussed above for the core MOS transistor. A specific embodiment is adding the drain extension implants for the input-output transistor to the drain extension implants for the core transistor to form the emitter regions of the bipolar junction transistors.

Figure 3:
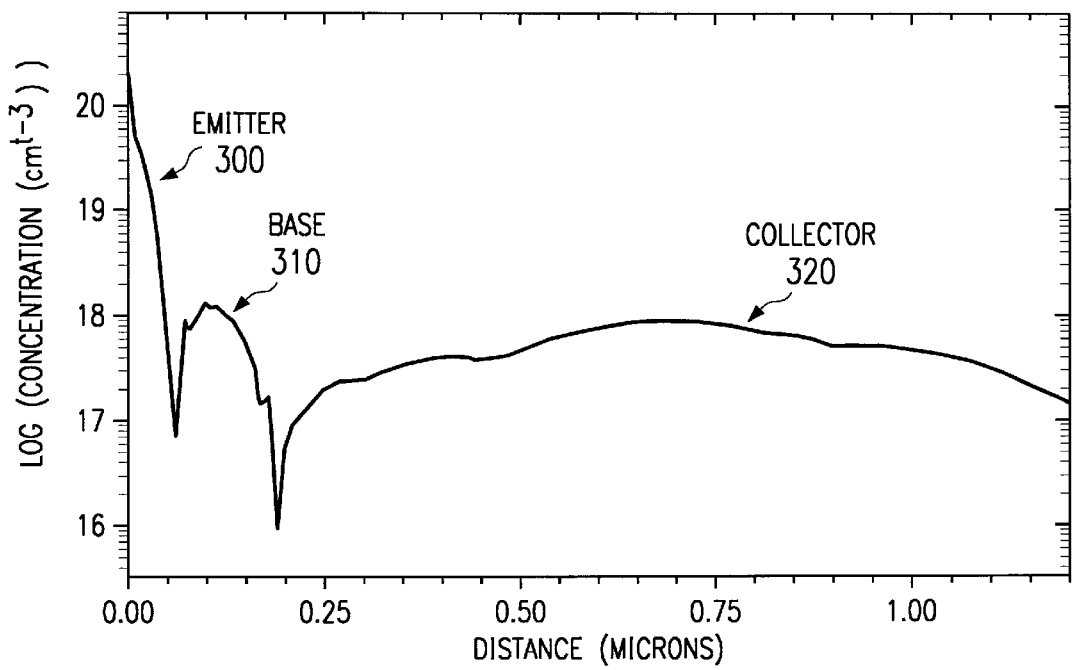
FIG. 3 is a doping concentration plot of a pnp transistor according to an embodiment of the instant invention.
Figure 4:
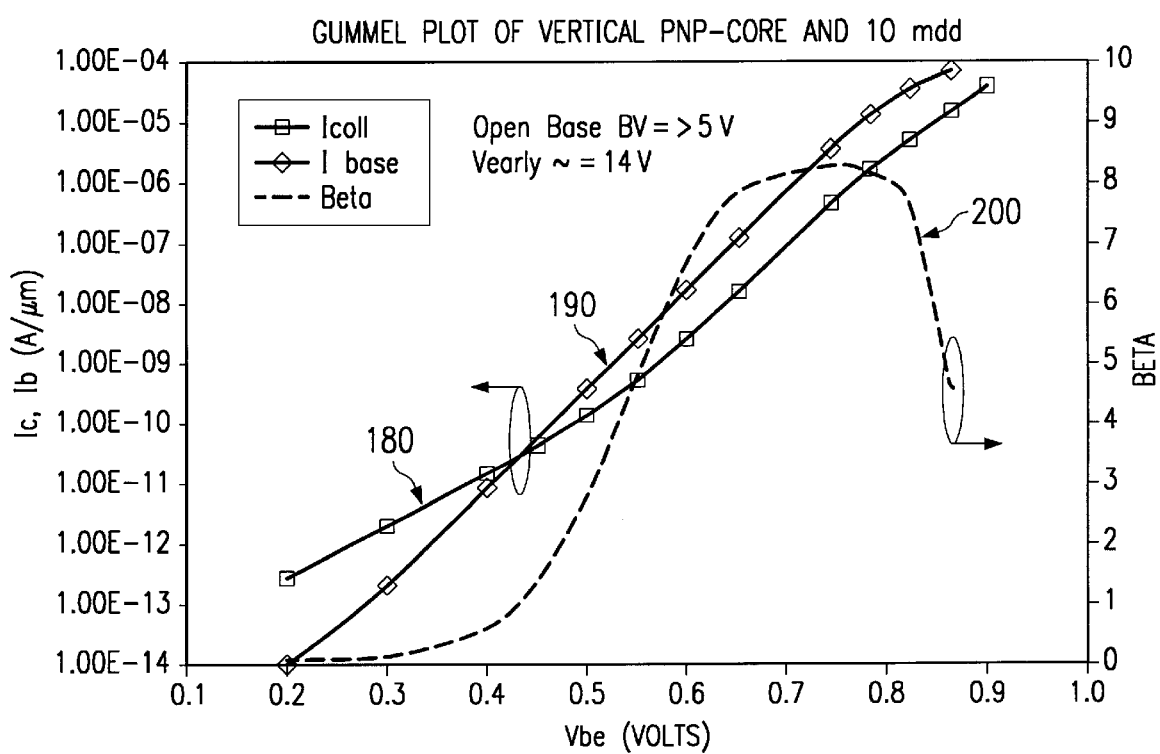
FIG. 4 is a Gummel plot for the pnp transistor shown in FIG. 3.

Illustrated in FIG. 3 is a doping profile for a specific embodiment of a pnp transistor according to the instant invention. In the Figure, the emitter region 300 is formed using the p-type drain extension implant, the base region 310 is formed using the n-type pocket, and the collector 320 comprises the p-well. For the transistor used to obtain the concentration profiles shown in FIG. 3, the resulting Gummel Plot showing the base current 180, collector current 190, and transistor beta (B) 200 is illustrated in FIG. 4. The transistor has a maximum beta of approximately 8.

Figure 5C:
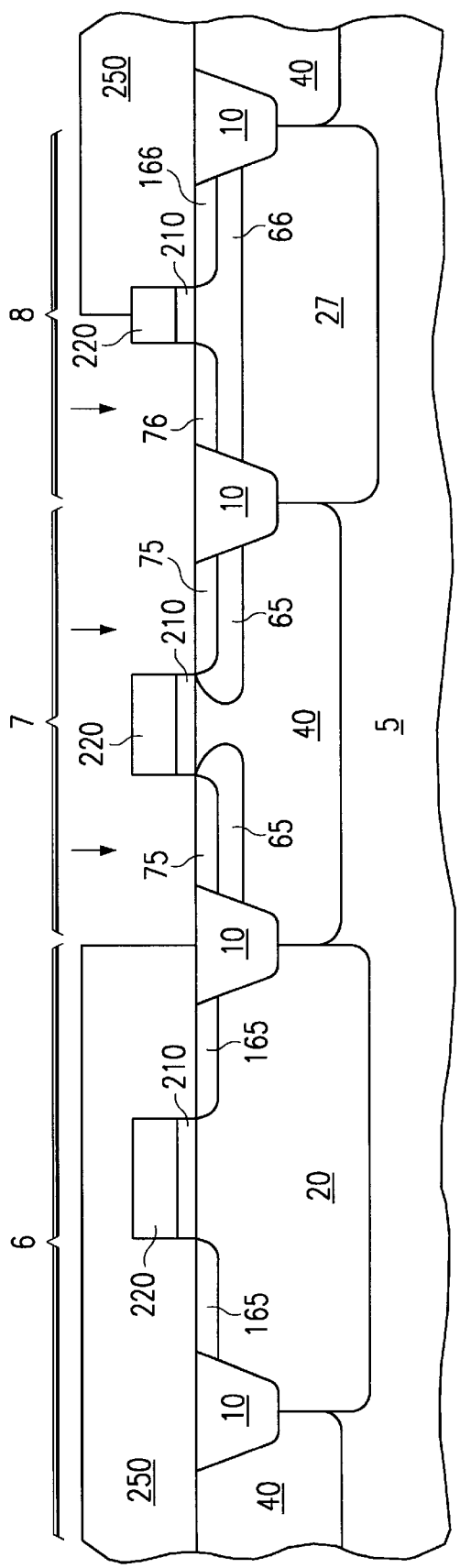
Figure 5D:
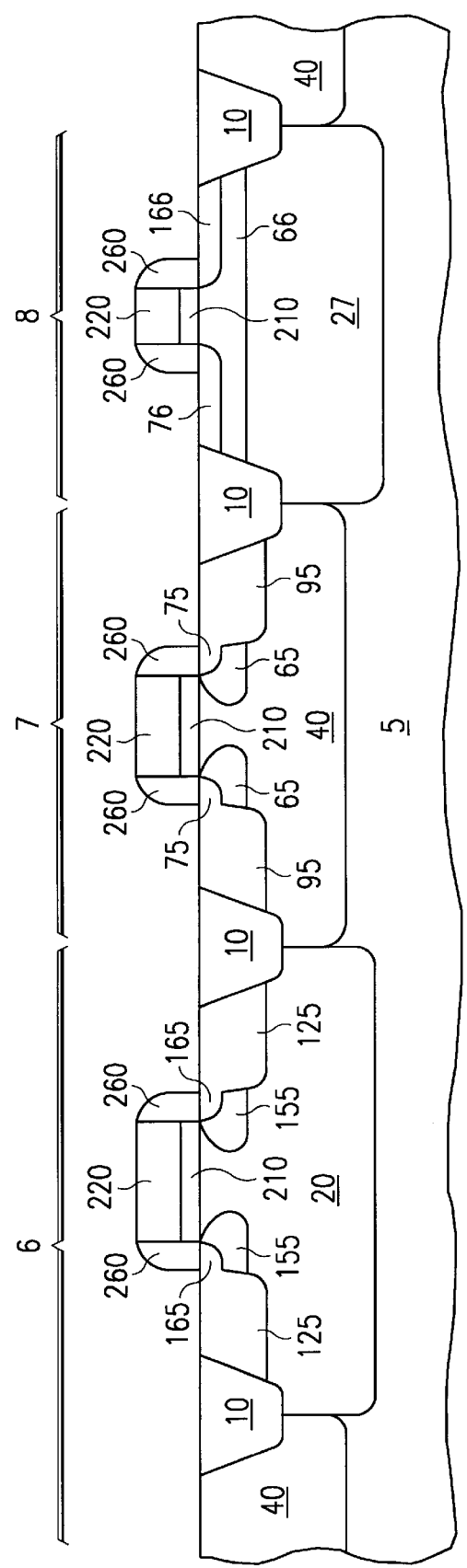

FIGS. 5A–5D illustrate a further embodiment of the instant invention. Shown in FIG. 5A is a semiconductor body 5 in which isolation structures 10, a p-well region 20, a n-well region 40, and a collector region 27 have been formed. The collector region 27 and the p-well region 20 are formed using the same implants. A PMOS transistor will be fabricated in section 7, a NMOS transistor in section 6 and a bipolar junction transistor in section 8. During the formation of the MOS gate dielectric layer and polysilicon gate electrode using standard processing methods, the dielectric layer 210 and the polysilicon layer 220 are formed. The layers 210 and 220 are patterned simultaneously with the CMOS transistor gates to form a "gate-like" structure of length L. The dielectric layer 210 can be a material selected from the group consisting of silicon oxide, silicon nitride, silicon oxynitride and any material with similar properties. A patterned photoresist film 230 is formed and the structure implanted with the n-type CMOS pocket implant. The length of the "gate-like" structure L in section 8 must be such that the angled n-type pocket implant forms the contiguous n-type region 66. As shown in FIG. 5B, a patterned resist film 240 is formed and the structure implanted with the n-t:ype drain extension implant to form region 166. This implant is self aligned with the "gate-like" structure. Region 165, the drain extension region for the NMOS transistor is also formed with this implant. In FIG. 5C, a patterned resist film 250 is formed and the structure implanted with the p-type drain extension implant process. This implant forms regions 75, the drain extension for the PMOS transistor, and region 76. FIG. 5D shows the structure of FIG. 5C after the formation of sidewall structures 260 and metal silicide films 110 and the processing steps required to complete the formation of the NMOS 6, and the PMOS 7 transistor. The formation of the sidewall structures and the metal silicide film is well known in the art. Regions 27, 66, and 76 will form the collector, base, and emitter regions of the pnp transistor. Region 166 will allow contact to the base region. The main advantage of FIG. 5D is that the "gate-like" structure provides the necessary separation of the base and emitter contact without adding any extra processing steps to the CMOS mixed signal process.

Figure 6C:
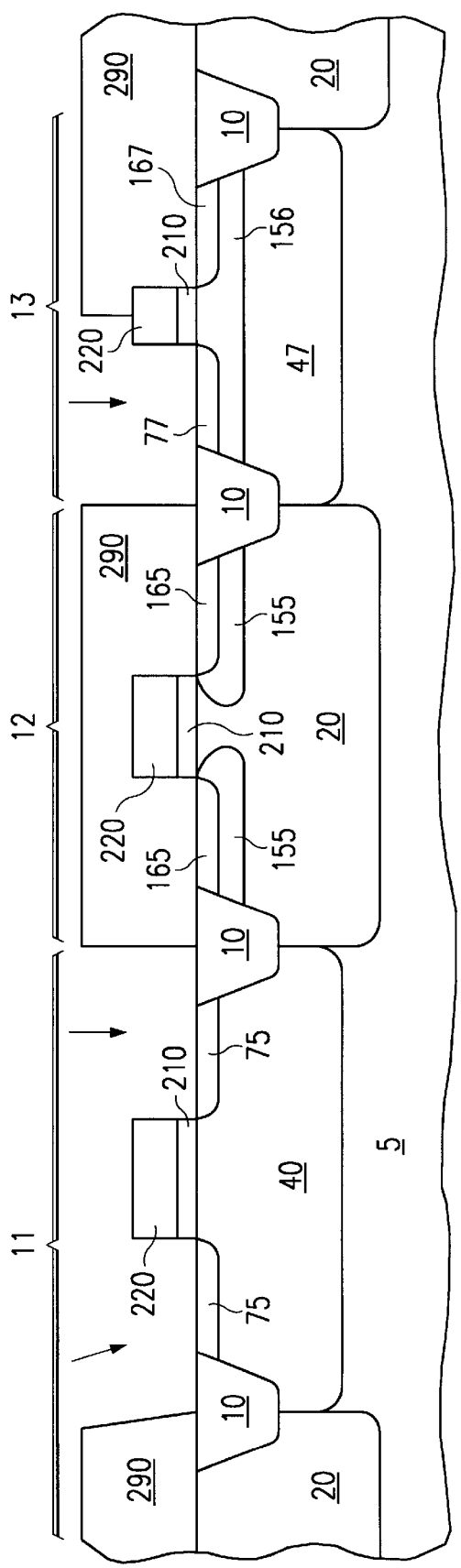
Figure 6D:
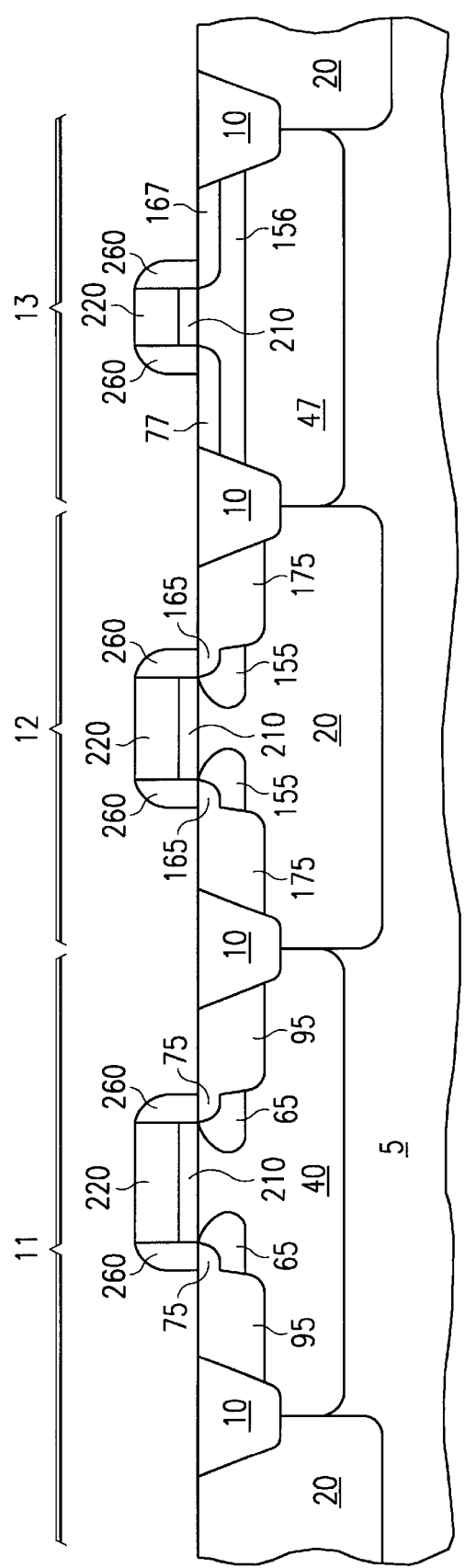

FIGS. 6A–6D illustrate a further embodiment of the instant invention. Shown in FIG. 6A is a semiconductor body 5 in which isolation structures 10, a n-well region 40, a p-well regions 20, and a collector region 47 have been formed. The collector region 47, and the n-well region 40 are formed using the same implants. A PMOS transistor will be fabricated in section 11, a NMOS transistor in section 12, and a npn transistor in section 13. During the formation of the MOS gate dielectric layer and polysilicon gate electrode using standard processing techniques, the dielectric layer 210 and the polysilicon layer 220 are formed. The layers 210 and 220 are patterned simultaneously with the CMOS transistor gates to form a "gate-like" structure of length L in section 13. A patterned photoresist film 270 is formed and the structure implanted with the p-type CMOS pocket implant. The length of the "gate-like" structure L must be such that the angled n-type pocket implant forms the contiguous n-type region 156. This implant also forms region 155, the NMOS pocket region. As shown in FIG. 6B, a patterned resist film 280 is formed and the structure implanted with the p-type drain extension implant to form regions 167 and 165. This implant is self aligned with the "gate-like" structure in section 13. In FIG. 6C, a patterned resist film 290 is formed and the structure implanted with the n-type drain extension implant process forming regions 75 and 77. FIG. 6D shows the structure of FIG. 6C after the formation of sidewall structures 260 and metal silicide films 110 and any additional processes necessary to complete the fabrication of the NMOS 12 and PMOS 11 transistors. The formation of sidewall structures is well known in the art. Regions 47, 156, and 167 will form the collector, base, and emitter regions of the pnp transistor. Region 77 will allow contact to the base region. The main advantage of FIG. 6D is that the "gate-like" structure provides the necessary separation of the base and emitter contact without adding any extra processing steps to the CMOS mixed signal process.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of forming an integrated circuit bipolar junction transistor, comprising:

providing a semiconductor body;

forming a collector region of said integrated circuit bipolar junction transistor with a plurality of implants;

forming a base region of said integrated circuit bipolar junction transistor with a metal oxide semiconductor transistor pocket implant; and forming a emitter region of said integrated circuit bipolar junction transistor with a metal oxide semiconductor transistor drain extension implant.

2. The method of claim 1 wherein said plurality of implants comprises:

a well implant; and a threshold voltage implant.

3. The method of claim 2 wherein said plurality of implants are p-type.

4. The method of claim 1 wherein said metal oxide semiconductor transistor pocket implant is n-type.

5. The method of claim 1 wherein said metal oxide semiconductor transistor drain extension implant is p-type.

6. The method of claim 2 wherein said plurality of implants are n-type.

7. The method of claim 1 wherein said metal oxide semiconductor transistor pocket implant is p-type.

8. The method of claim 1 wherein said metal oxide semiconductor transistor drain extension implant is n-type.

9. A method of forming an integrated circuit bipolar junction transistor, comprising:

providing a semiconductor body;

forming a collector region of said integrated circuit bipolar junction transistor with a plurality of implants;

simultaneously forming a base region of said integrated circuit bipolar junction transistor and a pocket region of a metal oxide semiconductor transistor with a metal oxide semiconductor transistor pocket implant; and simultaneously forming an emitter region of said integrated circuit bipolar junction transistor and a drain extension region of a metal oxide semiconductor transistor with a metal oxide semiconductor transistor drain extension implant.

10. The method of claim 9 wherein said plurality of implants comprises:

a well implant; and a threshold voltage implant.

11. The method of claim 10 wherein said plurality of implants are p-type.

12. The method of claim 9 wherein said metal oxide semiconductor transistor pocket implant is n-type.

13. The method of claim 9 wherein said metal oxide semiconductor transistor drain extension implant is p-type.

14. The method of claim 9 wherein said plurality of implants are n-type.

15. The method of claim 9 wherein said metal oxide semiconductor transistor pocket implant is p-type.

16. The method of claim 9 wherein said metal oxide semiconductor transistor drain extension implant is n-type.

* * * * *